(12) United States Patent
Malek et al.

(10) Patent No.: US 9,523,723 B2
(45) Date of Patent: Dec. 20, 2016

(54) FRACTIONAL ORDER POWER POINT TRACKING

(71) Applicants: Hadi Malek, Logan, UT (US); YangQuan Chen, Atwater, CA (US)

(72) Inventors: Hadi Malek, Logan, UT (US); YangQuan Chen, Atwater, CA (US)

(73) Assignee: Utah State University, Logan, UT (US)

( * ) Notice: Subject to any disclaimer, the term of this patent is extended or adjusted under 35 U.S.C. 154(b) by 926 days.

(21) Appl. No.: 13/859,394

(22) Filed: Apr. 9, 2013

(65) Prior Publication Data

US 2013/0268219 A1     Oct. 10, 2013

Related U.S. Application Data

(60) Provisional application No. 61/621,616, filed on Apr. 9, 2012.

(51) Int. Cl.
*G06F 19/00* (2011.01)
*G01R 21/06* (2006.01)
*G05F 1/67* (2006.01)

(52) U.S. Cl.
CPC ............ *G01R 21/06* (2013.01); *G05F 1/67* (2013.01)

(58) Field of Classification Search
CPC ........ H02J 3/383; Y02E 10/563; Y02E 10/566
USPC .................... 702/60, 64, 182–185
See application file for complete search history.

(56) References Cited

U.S. PATENT DOCUMENTS

| | | | |
|---|---|---|---|
| 2008/0238195 A1 | 10/2008 | Shaver | |
| 2009/0218887 A1 | 9/2009 | Ledenev | |
| 2009/0284078 A1 | 11/2009 | Zhang | |
| 2010/0219690 A1 | 9/2010 | Femia | |
| 2011/0109346 A1 | 5/2011 | Moussaoui | |
| 2011/0134668 A1 | 6/2011 | Cho | |
| 2014/0091622 A1* | 4/2014 | Lucas | H02P 6/17 307/19 |

FOREIGN PATENT DOCUMENTS

| | | |
|---|---|---|
| KR | 100886891 | 3/2009 |
| WO | 2005112551 | 12/2005 |

OTHER PUBLICATIONS

Chen et al., Discretization Schemes for Fractional-Order Differentiators and Integrators, IEEE Transactions on Circuits and Systems, Mar. 2002, p. 363-367, vol. 49 No. 3, Institute of Electrical and Electronics Engineers, Piscataway, NJ.
Barbosa et al., Implementation of Discrete-Time Fractional Order Controllers based on LS Approximations, Acta Polytechnica Hungarica, 2006, p. 1-22, vol. 3 Issue 4, Obuda University, Hungary.
Petras et al., Digital Fractional Order Controllers Realized by Pic Microprocessor: Experimental Results, Carpathian Control Conference, May 2003, p. 873-876, Institute of Electrical and Electronics Engineers, Piscataway, NJ.

(Continued)

*Primary Examiner* — Edward Raymond (57) ABSTRACT

For maximum power point tracking, a method filters a power monitoring signal with a tracking fractional order filter to generate a filtered power monitoring signal. The method further generates a tracking signal tracking the power point from the filtered power monitoring signal.

18 Claims, 9 Drawing Sheets

(56) References Cited

OTHER PUBLICATIONS

Bhaskaran et al., Practical Tuning of Fractional Order Proportional and Integral Controller, Proceedings of the ASME International Deign Engineering Technical Conferences & Computers and Information in Engineering Conference , Sep. 4, 2007, p. 1-14, American Society of Mechanical Engineers, New York, NY.

Zhang et al., A Modified MPPT Method with Variable Pertubation Step for Photovoltaic System, 2009 IEEE 6th International Power Electronics and Motion Control Conference, May 17, 2009, p. 2096-2099, Institute of Electrical and Electronics Engineers, Piscataway, NJ.

Lei et al., Extremum Seeking Control Based Integration of MPPT and Degradation Detection for Photovoltaic Arrays, American Control Conference 2010, Jun. 30, 2010, p. 3536-3541, Institute of Electrical and Electronics Engineers, Piscataway, NJ.

Bergeon, On Bode's "Ideal cut-off Characteristics" and non-rational feedback laws, Journal, 2005, Instituts universitaires de technologie, France.

Moura, A Switched Extremum Seeking Approach to Maximum Power Point Tracking in Photovoltaic Systems, Project, Apr. 21, 2009, Project, San Diego, CA.

Chen et al., A New IIR-type digital fractional order differentiator, Signal Processing, Nov. 2003, p. 2359-2365, vol. 83 Issue 11, Elsevier B.V., Amsterdam Netherlands.

Bohannan, Analog Fractional Order Controller in Temperature and Motor Control Applications, Journal of Vibration and Control, Sep. 2008, p. 1487-1498, vol. 14, Sage Publications, Thousand Oaks, CA.

Krishna, Studies on fractional order differentiators and integrators: A survey, Signal Processing, Jul. 7, 2010, p. 386-426, vol. 91 issue 3, Elsevier B.V., Amsterdam, Netherlands.

Ariyur et al., Real-Time Optimization by Extremum-Seeking Control, 2003, Wiley, Hoboken, NJ.

Krstic, Extremum Seeking Feedback Tools for Real-Time Optimization, Workshop on Large-Scale Robust Optimization, Aug. 31, 2005, Sandia National Laboratories, Albuquerque, NM.

Coopmans, Fractor and Fractroller, Fractional Order Calculus Day at Utah State University, Sep. 2, 2007, Logan, UT.

Nazarian, et al., Identifiability of Fractional Order Systems Using Input Output Frequency Contents, ISA Transactions, vol. 49, Dec. 14, 2009, pp. 207-214.

\* cited by examiner

FRACTIONAL ORDER POWER POINT TRACKING

This application claims priority to U.S. Provisional Patent Application No. 61/621,616 entitled "FRACTIONAL ORDER MPPT TRACKING" and filed on Apr. 9, 2012 for Hadi Malek, which is incorporated herein by reference.

TECHNICAL FIELD

The present disclosure relates to power point tracking in general and specifically to fractional order maximum power point tracking.

BACKGROUND

Some energy sources such as renewable energy devices may be subject to variable operating conditions such as wind speed, temperature, component degradation, and the like. As a result, the power point at which maximum power can be extracted from such devices is constantly changing.

SUMMARY

A method is disclosed for maximum power point tracking. The method filters a power monitoring signal with a tracking fractional order filter to generate a filtered power monitoring signal. The method further generates a tracking signal tracking the power point from the filtered power monitoring signal. An apparatus and system are also disclosed that perform the functions of the method.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing executable code. The storage devices may be tangible, non-transitory, and/or non-transmission.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in executable code and/or software for execution by various types of processors. An identified module of executable code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices, and may exist, at least partially, merely as electronic signals on a system or network. Where a module or portions of a module are implemented in software, the software portions are stored on one or more computer readable storage devices.

Any combination of one or more computer readable medium may be utilized. The computer readable medium may be a machine readable signal medium or a storage device. The computer readable medium may be a storage device storing the executable code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A machine readable signal medium may include a propagated data signal with executable code embodied therein, for example, in baseband or as part of a carrier wave. Such a propagated signal may take any of a variety of forms, including, but not limited to, electro-magnetic, optical, or any suitable combination thereof. A machine readable signal medium may be any storage device that is not a computer readable storage medium and that can communicate, propagate, or transport a program for use by or in connection with an instruction execution system, apparatus, or device. Executable code embodied on a storage device may be transmitted using any appropriate medium, including but not limited to wireless, wire line, optical fiber cable, Radio Frequency (RF), etc. or any suitable combination of the foregoing.

Executable code for carrying out operations for embodiments may be written in any combination of one or more programming languages, including an object oriented programming language such as Java, Smalltalk, C++ or the like and conventional procedural programming languages, such as the "C" programming language or similar programming languages. The executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by executable code. These executable code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The executable code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The executable code may also be loaded onto a computer, other programmable data processing apparatus, or other devices to cause a series of operational steps to be performed on the computer, other programmable apparatus or other devices to produce a computer implemented process such that the program code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and executable code.

Descriptions of Figures may refer to elements described in previous Figures, like numbers referring to like elements. The present disclosure covers apparatii, methods, and systems for maximizing power transfer between a power generating device and a load and is particularly applicable to renewable energy applications such as solar, wind and tidal energy. The following examples are illustrative only and are not intended to limit the disclosure in any way.

FIGS. 1A-D are schematic block diagrams depicting several examples of maximum power point tracking systems 100a-d. The systems 100 include a power generator 110, a power converter 120, a load 130, a power monitor 140 and an MPPT controller 150 in various configurations. The systems 100 may also be arranged in other configurations beyond the depicted configurations 100a-100d.

The power generator 110 may harness a renewable energy source or the like that provides raw power 112 that varies with conditions such as weather and the current angle of the sun. The power converter 120 may receive the raw power 112 at a first power point (i.e. voltage and current) and provide an output power 122 at a second power point that matches the load 130.

The raw power 112 and the output power 122 may have AC and/or DC components. Consequently, the power converter may be a DC to DC, a DC to AC, an AC to DC, an AC to AC power converter, or any combination thereof. In some embodiments, the load 130 may also be variable and even abrupt in nature and the MPPT controller 150 may be responsive to changes in the load 130 while maintaining a high degree of efficiency.

The power monitor 140 may monitor the raw power 112 and/or the output power 122, or the like, and provide a power monitoring signal 142 to the MPPT controller 150. The power monitoring signal 142 may be a current and a voltage. The MPPT controller 150 may track the power monitoring signal 142 and maximize the power transfer that occurs within the system 1000 via the control signal 152. In the depicted embodiments, the control signal 152 is a control signal that facilitates finding and tracking an extremum (i.e. optimal) power point. The MPPT controller 150 may be a fractional order extremum seeking controller (FO ESC) that converges to a maximum power point (MPPT) faster than integer order MPPT controllers. By providing faster convergence, the efficiency of the systems 100 may be improved over prior art maximum power point tracking systems.

Figure 1A:
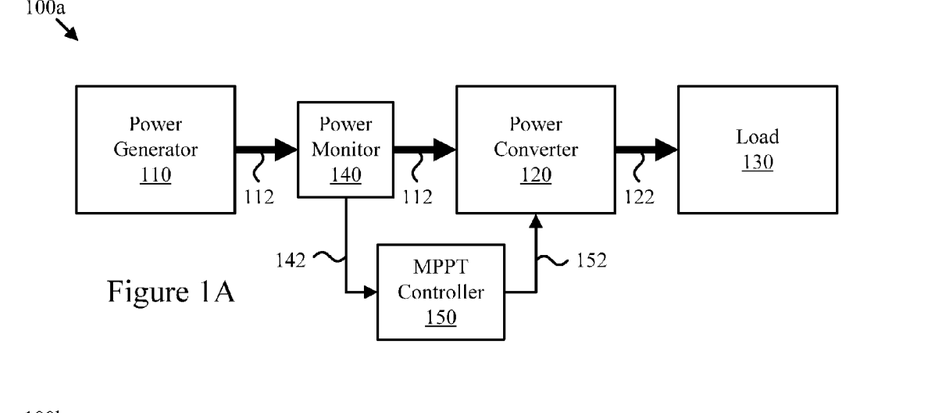
FIGS. 1A-D are schematic block diagrams depicting embodiments of maximum power point tracking systems.

FIG. 1A depicts the power monitor 140 monitoring the raw power 112 and providing the power monitoring signal 142 from the raw power 112. The MPPT controller 150 provides the control signal 152 to the power converter 120.

Figure 1B:
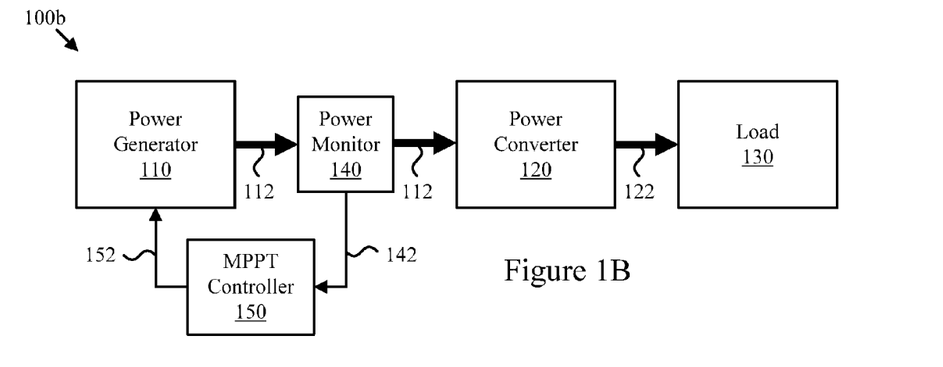

FIG. 1B also depicts the power monitor 140 monitoring the raw power 112. The power monitor 140 provides the power monitoring signal 142 to the MPPT controller 150. The MPPT controller 150 provides the control signal 152 to the power generator 110.

Figure 1C:
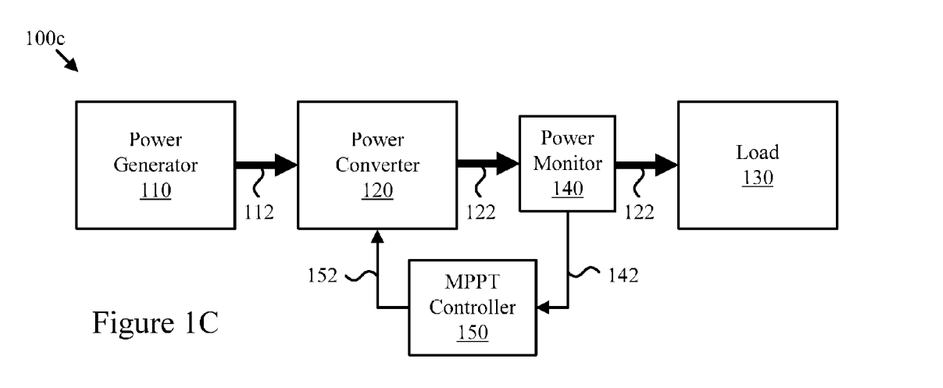

FIG. 1C depicts the power monitor 140 monitoring the output power 122 of the power converter 120. The power monitor 140 provides the power monitoring signal 142 from the output power 122 to the MPPT controller 150. The MPPT controller 150 provides a control signal 152 to the power converter 120.

Figure 1D:
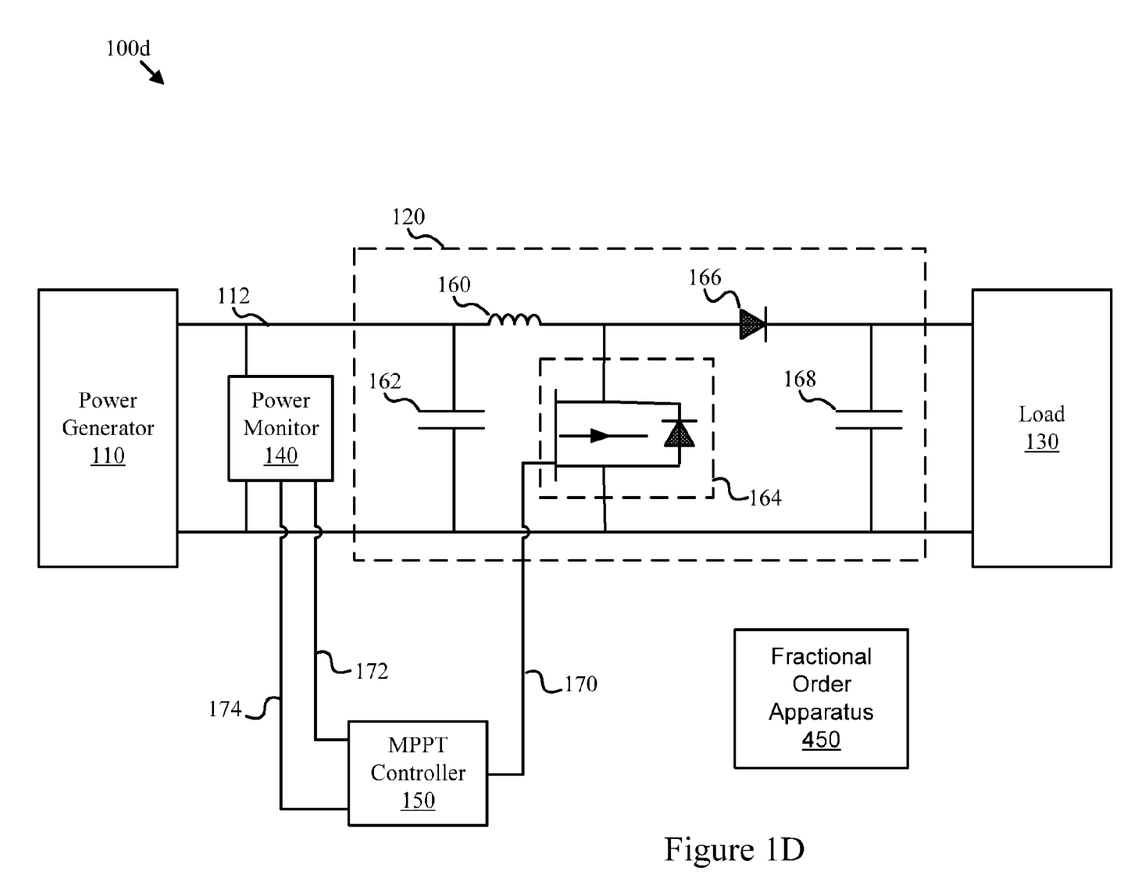

FIG. 1D depicts one embodiment of the system 100a of FIG. 1A. The power converter 120 of the system 100d comprises an inductor 160, one or more capacitors 162, 168, a diode 166, and a switch 164. The power monitor 140 monitors the raw power 112 and provides the power monitoring signal 142 comprising a voltage signal 174 and a current signal 172 to the MPPT controller 150. The MPPT controller 150 generates a pulse width modulation (PWM) control signal 152 that modifies the duty cycle of the power converter 120 by controlling the switch 164. Modifying the duty cycle modifies the current, voltage, and resulting power of the output power 122. The MPPT controller 150 modifies the power point of the power converter 120 to maximize the output power 122 as will be described hereafter.

In one embodiment, the system 100d includes a fractional order apparatus 450. The fractional order apparatus 450 may determine stable coefficients and fractional orders for the MPPT controller 150 as will be described hereafter.

Figure 2A:
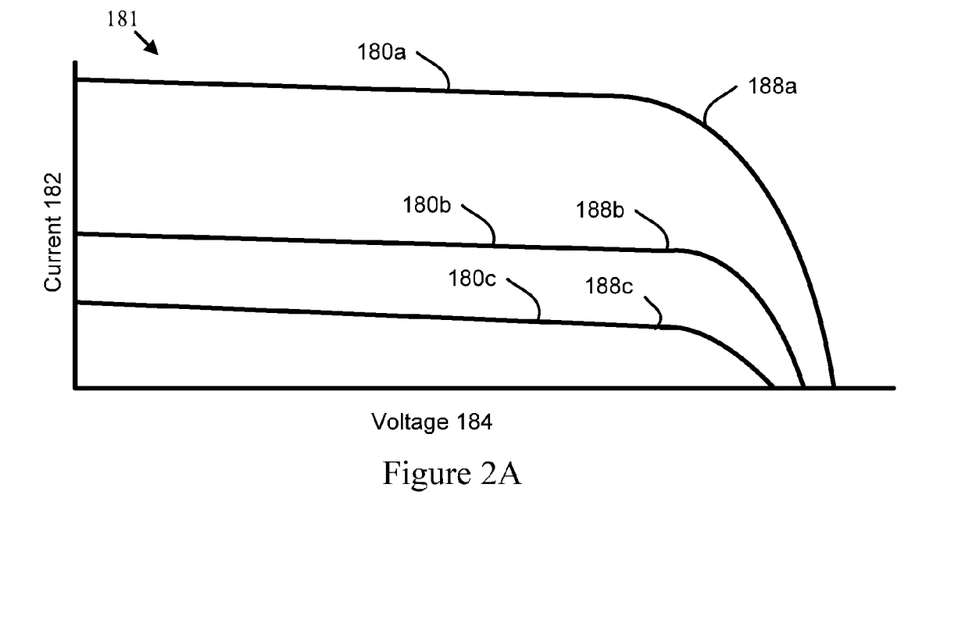
FIGS. 2A-B are graphs illustrating one embodiment of power points.
Figure 2B:
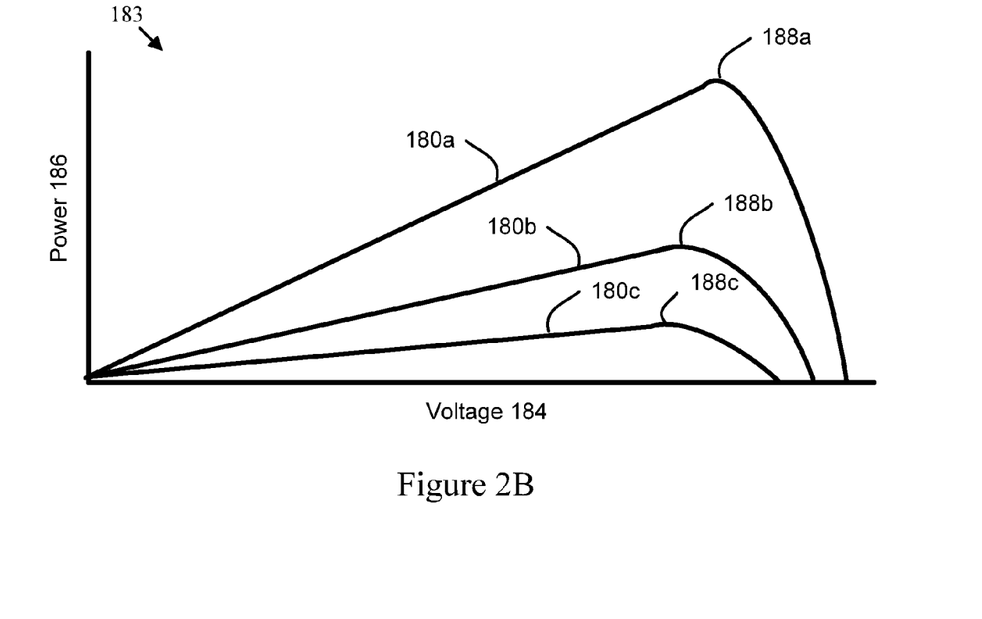

FIGS. 2A-B are graphs 181, 183 illustrating one embodiment of power points 188. The graph 181 of FIG. 2A shows current 182 as a function of voltage 184 for a plurality of power levels 180. The power levels 180 may be the raw power 112. Alternatively, the power levels 180 may be the output power 122. The extremum or maximum power point 188 for each power level 180 is found where the derivative of the current 182 with respect to the voltage 184 is equal and opposite to the ratio of current 182 to voltage.

The graph 183 of FIG. 2B shows power 186 as a function of voltage 184 for a plurality of power levels 180. The power levels 180 may be the raw power 112. Alternatively, the power levels 180 may be the output power 122. The extremum or maximum power point 188 for each power level 180 is where the derivative of the power 186 with respect to the voltage 184 (dP/dV) is zero.

The embodiments described herein employ the MPPT controller 150 to track the maximum power point 188 and maximize the output power 122. The MPPT controller 150 uses one or more fractional order filters to track the maximum power point 188 as will be described hereafter.

Figure 3:
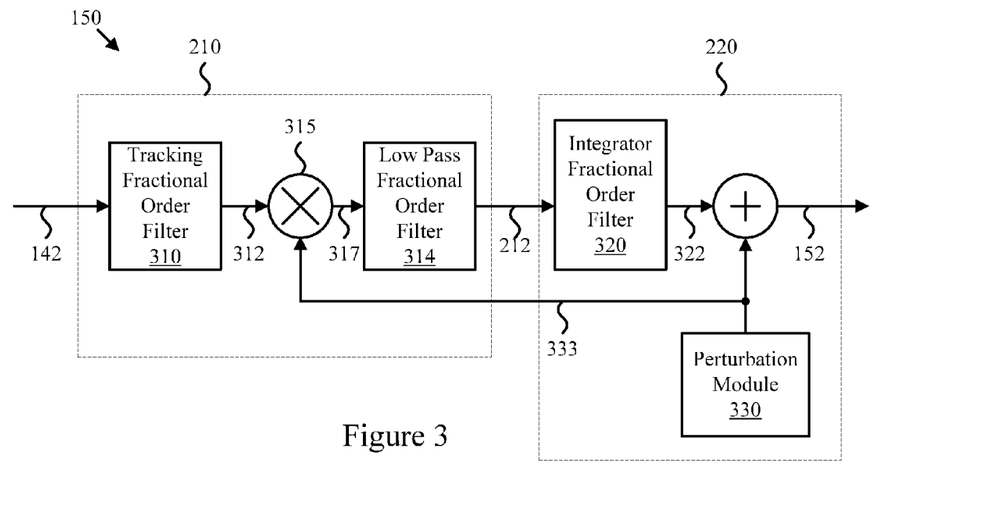
FIG. 3 is a schematic block diagram illustrating one embodiment of a maximum power point tracking (MPPT) controller.

FIG. 3 is a schematic block diagram illustrating one embodiment of the MPPT controller 150. The depicted MPPT controller 150 includes a demodulation module 210 and a modulation module 220. The MPPT controller 150 is one embodiment of the MPPT controller 150 depicted in FIG. 1A-D.

The demodulation module 210 receives the power monitor signal 142 and generates a tracking signal 212. In one embodiment, a tracking fractional order filter 310 filters the power monitor signal 142 to generate a filtered power monitoring signal 312. The filtered power monitoring signal 312 MS may be calculated using equation 1, where I is current 182 and V is voltage 184.

$$MS = dI/dV \quad \text{Equation 1}$$

In one embodiment, the tracking fractional order filter 310 is a high pass filter. The tracking fractional order filter 310 may have a frequency domain response H(s) given by equation 2, where q is a fractional order between 0 and 1 and $\omega_h$ is the cut-off frequency of the high pass filter.

$$H(s) = \frac{s^q}{s^q + \omega_h} \quad \text{Equation 2}$$

In one embodiment, the tracking fractional order filter 310 is a high pass Bode Ideal Cutoff (BICO) filter. The frequency domain response H(s) of the BICO filter may be calculated using equation 3, where $\omega_0$ is frequency of the output power 122, s is frequency, K is a constant, and $0 < q \le 1$.

$$H(s) = \frac{K}{\left(\frac{s}{\omega_0} + \sqrt{\left(\frac{s}{\omega_0}\right)^2 + 1}\right)^q} \quad \text{Equation 3}$$

Alternatively, the digital domain response H(z) of the BICO filter may be calculated using equation 4, where z is a complex number and a, b, c, d, e, f, g, h, k, and l are real number constants.

$$H(z) = \frac{az^5 - bz^4 + cz^3 - dz^2 - ez - f}{z^5 - gz^4 + hz^3 - jz^2 + kz - l} \quad \text{Equation 4}$$

Table 1 lists values for the real number constants. The real number coefficients may be stable coefficients.

| Constant | High Pass Filter Value | Low Pass Filter Value |
|---|---|---|
| a | 0.5761 | 0.1853 |
| b | 1.781 | 0.4578 |
| c | 2.612 | 0.3825 |
| d | 2.245 | 0.01705 |
| e | 1.07 | 0.1319 |
| f | 0.253 | 0.05504 |
| g | 2.149 | 3.878 |
| h | 2.828 | 6.344 |
| j | 1.961 | 5.398 |
| k | 0.8551 | 2.379 |
| l | 0.1424 | 0.4314 |

In one embodiment, a perturbation module 330 generates a perturbation signal 333 with which a demodulator 315 demodulates the filtered power monitoring signal 312 to generate a demodulated power monitoring signal 317. The perturbation signal 333 may be a sine wave with a frequency of $\omega t$.

In one embodiment, the demodulated power monitoring signal 317 is the tracking signal 212. In an alternate embodiment, a low pass fractional order filter 314 filters the demodulated power monitoring signal 317 to generate the tracking signal 212. The low pass fractional order filter 314 may have a frequency domain response H(s) given by equation 3, where q is a fractional order, $0 < q \le 1$ and $\omega_1$ is the cut-off frequency of the low pass filter.

$$H(s) = \frac{\omega_l}{s^q + \omega_l} \quad \text{Equation 5}$$

In one embodiment, the low pass fractional order filter 314 is a low pass filter BICO filter. The frequency domain response H(s) of the low pass BICO filter may be calculated using equation 6.

$$H(s) = \frac{K}{\left(\frac{s}{\omega_0} + \sqrt{\left(\frac{s}{\omega_0}\right)^2 + 1}\right)^q} \quad \text{Equation 6}$$

Alternatively, the digital domain response H(z) of the low pass BICO filter may be calculated using equation 4, where z is a complex number and a, b, c, d, e, f, g, h, k, and l are real number constants. The real number constants have the values defined in Table 1.

In one embodiment, the tracking fractional order filter 310 is a high pass BICO filter and the low pass fractional order filter 314 is a complementary fractional order filter that attenuates any residual portions of the perturbation signal 333 that are not effectively removed by the demodulator 315.

The modulation module 220 receives the tracking signal 212 and generates the control signal 152. An integrator fractional order filter 320 may integrate the tracking signal to generate a feedback signal 322. The integrator fractional order filter 320 may have a frequency domain response H(s) given by equation 7, where q is a fractional order between 0 and 1 and K is a constant.

$$H(s) = \frac{K}{s^q} \quad \text{Equation 7}$$

In one embodiment, the perturbation signal 333 is summed with the feedback signal 322 to generate the control signal 152. The control signal 152 may modify the operating point of the system 100 to the maximum power point 188.

Figure 4:
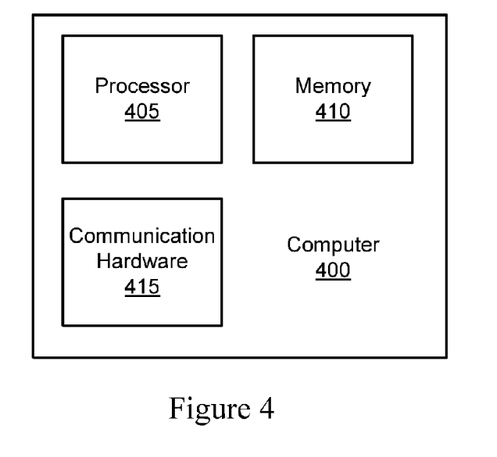
FIG. 4 is a schematic block diagram illustrating one embodiment of a computer.

FIG. 4 is a schematic block diagram illustrating one embodiment of a computer 400. The computer includes a processor 405, a memory 410, and communication hardware 415. The memory 410 may be a semiconductor storage device, a hard disk storage device, a micromechanical storage device, an optical storage device, and the like. The memory 410 may store executable code. The processor 405 may execute the executable code. The communication hardware 415 may communicate with other devices.

Figure 5:
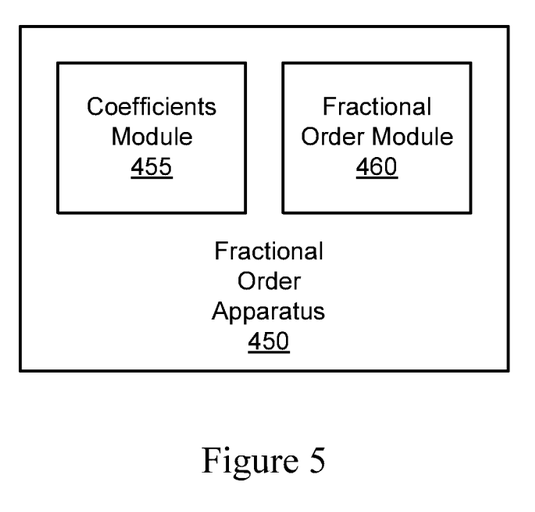
FIG. 5 is a schematic block diagram illustrating one embodiment of a fractional order apparatus.

FIG. 5 is a schematic block diagram illustrating one embodiment of a fractional order apparatus 450. The apparatus 450 may be embodied in the computer 400. The apparatus 450 includes a coefficients module 455 and a fractional order module 460. In one embodiment, the coefficients module 455 and the fractional order module 460 are embodied in a computer readable storage medium such as the memory 410. The computer readable storage medium may store executable code that when executed by the processor 405 performs the functions of the apparatus 450.

In one embodiment, the coefficients module 455 calculates stable coefficients for an integer order filter. The integer order filter may perform the functions of the tracking fractional order filter 310, the low pass fractional order filter 314, and/or the integrator fractional order filter 320.

The fractional order module 460 may substitute a fractional order for the integer order of the integer order filter as will be described hereafter. Employing the fractional order filters may make the MPPT controller 150 more responsive to changes in raw power 112 and increase the output power 122.

Figure 6:
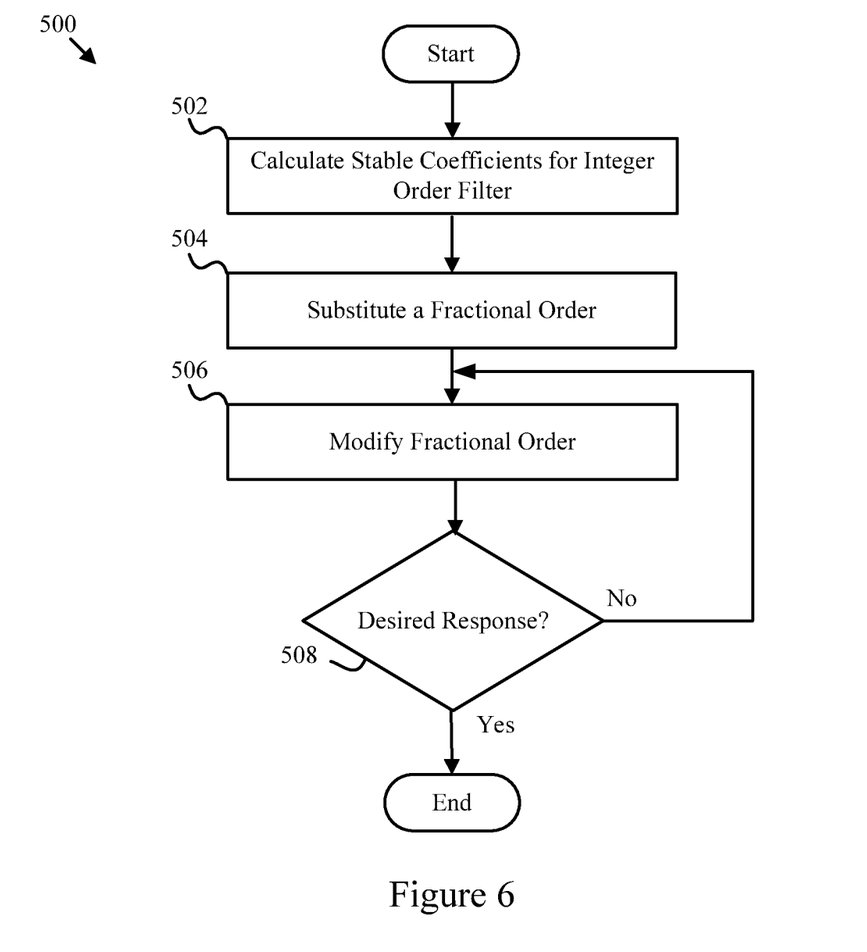
FIG. 6 is a schematic flow chart diagram illustrating one embodiment of a fractional order filter determination method.

FIG. 6 is a schematic flow chart diagram illustrating one embodiment of a fractional order filter determination method 500. The method 500 may be performed by a processor 405 executing program code. The program code may be stored in a computer readable storage medium. The method 500 determines the coefficients and parameters of the fractional order filter such as the tracking fractional order filter 310, the low pass fractional order filter 314, and/or the integrator fractional order filter 320.

The method 500 starts, and in one embodiment, the coefficients module 455 calculates 502 stable coefficients for the integer order filter. For example, the coefficients module 455 may calculate 502 stable coefficients for the tracking fractional order filter 310 using equation 8, where H(s) is the frequency domain response of the integer order filter.

$$H(s) = \frac{s}{s + \omega_h} \quad \text{Equation 8}$$

Similarly, the coefficients module 455 may calculate 502 stable coefficients for the low pass fractional order filter 314 using equation 9, where H(s) is the response of the integer order filter.

$$H(s) = \frac{\omega_l}{s + \omega_l} \qquad \text{Equation 9}$$

In addition, the coefficients module 455 may calculate 502 stable coefficients for the integrator fractional order filter 320 using equation 10, where H(s) is the frequency domain response of the integer order filter.

$$H(s) = \frac{K}{s} \qquad \text{Equation 10}$$

The fractional order module 460 may substitute 504 a fractional order between zero and one for the integer order of the integer order filter to generate a fractional order filter. The fractional order filter may be the tracking fractional order filter 310, the low pass fractional order filter 314, and/or the integrator fractional order filter 320. For example, the fractional order module 460 may substitute 504 the fractional order 0.66 for the integer order 1.

In one embodiment, the fractional order module 460 further modifies 506 the value of the fractional order. For example, the fractional order module 460 may reduce the value of the fractional order from 0.66 to 0.5.

The fractional order module 460 may further determine 508 if the response of the fractional order filter is the desired response. If the response of the fractional order filter is not the desired response, the fractional order module 460 may continue to modify 506 the fractional order. For example, if the response of the fractional order filter is too slow, the fractional order module 460 may reduce the value of the fractional order. Similarly, if the response of the fractional order filter is too fast, the fractional order module 460 may increase the value of the fractional order. However, the range of the fractional order will remain between zero and one. If the response of the fractional order filter is the desired response, the method 500 ends.

Figure 7:
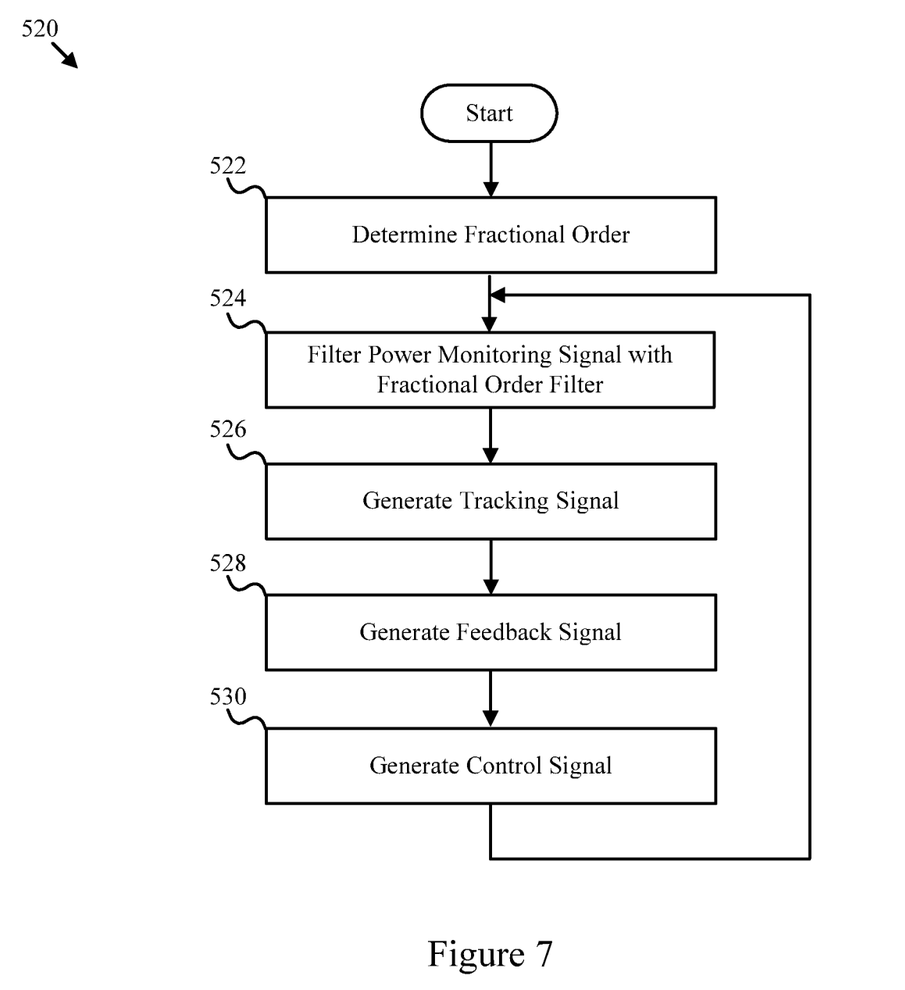
FIG. 7 is a schematic flow chart diagram illustrating one embodiment of power point tracking method.

FIG. 7 is a schematic flow chart diagram illustrating one embodiment of maximum power point tracking method 520. The method 520 may be performed by the system 100 and MPPT controller 150. The method 520 may be performed by analog hardware embedded in the MPPT controller 150. Alternatively, the method 520 may be performed by a computer 400 embedded in the MPPT controller 150. In one embodiment, the method 500 is performed by combinations of analog hardware and the computer 400.

The method 520 starts, and in one embodiment the fractional order apparatus 450 determines 522 the fractional order of the tracking fractional order filter 310, the low pass fractional order filter 314, and/or the integrator fractional order filter 320. The fractional order apparatus 450 may employ the method 500 of FIG. 6 to determine the stable coefficients and fractional order(s).

In one embodiment, the fractional order apparatus 450 dynamically determines 522 each fractional order. The fractional order may be reduced to increase a response for a fractional order filter. In addition, the fractional order may be increased to reduce the response for the fractional order filter.

In an alternative embodiment, the fractional orders of the tracking fractional order filter 310, the low pass fractional order filter 314, and/or the integrator fractional order filter 320 are fixed. For example, the fractional orders may be initialized to specified values when the MPPT controller 150 is initialized.

The tracking fractional order filter 310 of the demodulation module 210 may filter 524 the power monitoring signal 142 to generate the filtered power monitoring signal 312.

In one embodiment, the demodulation module 210 generates 526 the tracking signal 212 tracking the power point 188 from the filtered power monitoring signal 312. The demodulator 315 may demodulate the filtered power monitoring signal 312 with the perturbation signal 333 to generate the tracking signal 212. The demodulation module 210 may further filter the demodulated power monitoring signal 317 from the demodulator 315 with the low pass fractional order filter 314 to generate the tracking signal 212.

In one embodiment, the modulation module 220 generates 528 the feedback signal 322 by integrating the tracking signal 212 with the integrator fractional order filter 320 to form the feedback signal 322. In addition, the modulation module 220 may generate 530 the control signal 152 by summing the feedback signal 322 with the perturbation signal 333 to generate the control signal 152. The method 520 may loop to continue filtering 524 the power monitoring signal 142 and generating 530 the control signal 152

Figure 8:
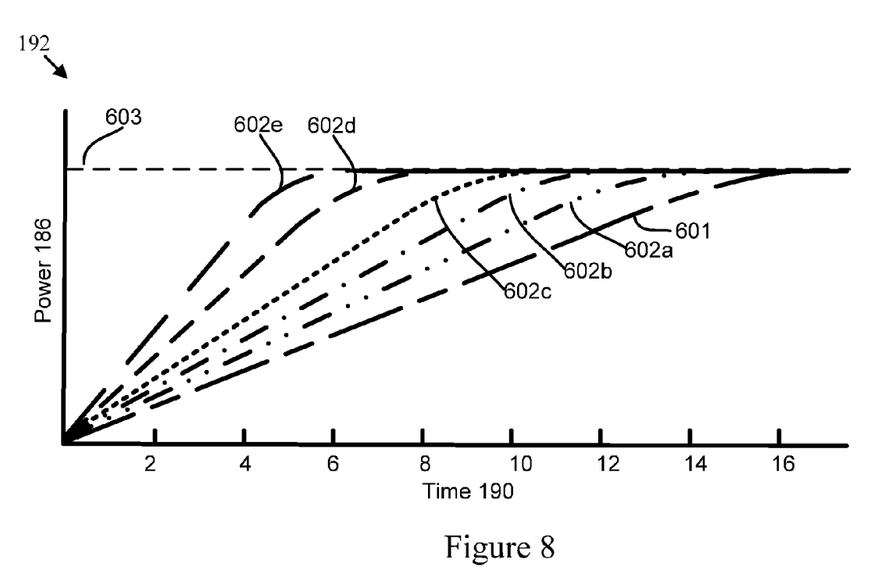
FIG. 8 is a response time chart.

FIG. 8 is response time chart that compares the power 601 of an integer order MPPT controller converging to the power 603 of the maximum power point 188 over time 190 with the power 602 of MPPT controllers 150 with fractional order filters converging to the power 603 of the maximum power point 188. Table 2 lists the order of each MPPT controller 150 for each power curve.

TABLE 2

| Curve | Order |
|---|---|
| 601 | 1 |
| 602a | 0.97 |
| 602b | 0.95 |
| 602c | 0.93 |
| 602d | 0.90 |
| 602e | 0.88 |

As depicted, the power 602 of MPPT controllers 150 with fraction order filters converges much more rapidly to the power 603 of the maximum power point 188, resulting in increased output power 122.

Figure 9:
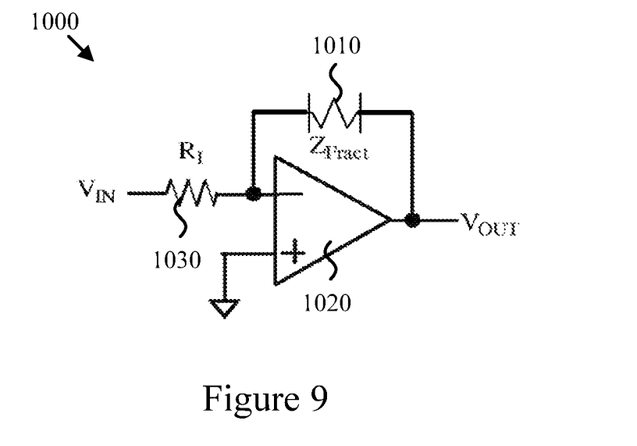
FIG. 9 is a schematic diagram of an analog fractional order integrator.

FIG. 9 is a schematic diagram of an analog fractional order integrator 1000. As depicted, the analog fraction order integrator 1000 includes a fractor 1010, an op amp 1020, and an input resistor 1030. One of skill in the art will appreciate that the gain provided by the integrator 1000 substantially corresponds to the ratio of the impedance of the fractor 1010 to the input resistor 1030. The analog fractional order integrator 1000 is one example of the integrator 320 depicted in FIG. 3.

The fractor 1010 is an analog component. In one embodiment, the fractor 1010 is fabricated by dipping a copper plate in an ionic gel and baking the component to solidify the gel. The fractor 1010 may have a frequency response that substantially corresponds to a fractional order function.

The embodiments employ fractional order filters to track the power point 188 of the system 100 with a more rapid response. As a result, the output power 122 is increased.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A method for power point tracking comprising:
receiving raw power from a power generator;
determining with a fractional order apparatus stable coefficients and fractional orders for a tracking fractional order filter and an integrator fractional order filter;
filtering through a demodulation module a power monitoring signal with the tracking fractional order filter and generating a filtered power monitoring signal;
demodulating the filtered power monitoring signal with a perturbation signal;
generating a tracking signal tracking the power point from the filtered power monitoring signal;
integrating through an integration module the tracking signal with the integrator fractional order filter to form a feedback signal and summing the feedback signal with the perturbation signal to generate a control signal; and
converting the raw power to output power through a power converter.

2. The method of claim 1, further comprising determining the tracking fractional order filter by
substituting a fractional order for the integer order.

3. The method of claim 1, wherein the power monitoring signal comprises a current and a voltage, the filtered power monitoring signal is calculated as dI/dV, and the power point is at dP/dV=0, where I is current, V is voltage, and P is Power.

4. The method of claim 1, wherein the tracking fractional order filter is a high pass Bode Ideal Cutoff (BICO) filter and the response of the high pass BICO filter H(s) is calculated as $$H(s) = \frac{K}{\left(\frac{s}{\omega_0} + \sqrt{\left(\frac{s}{\omega_0}\right)^2 + 1}\right)^q}$$

where $\omega_0$ is frequency of an output power, s is frequency, and $0 < q \le 1$.

5. The method of claim 4, wherein the response of the high pass BICO filter H(z) is calculated as $$H(z) = \frac{az^5 - bz^4 + cz^3 - dz^2 - ez - f}{z^5 - gz^4 + hz^3 - jz^2 + kz - l}$$

where z is a complex number and a, b, c, d, e, f, g, h, k, and l are real number constants.

6. The method of claim 1, further comprising filtering the tracking signal with a low pass fractional order filter.

7. An apparatus for power point tracking comprising:
a tracking fractional order filter filtering a power monitoring signal to generate a filtered power monitoring signal;
a coefficients module calculating stable coefficients for an integer order filter;
a fractional order module substituting a fractional order for the integer order to determine the tracking fractional order filter; and
a demodulator demodulating the filtered power monitoring signal with a perturbation signal to generate a tracking signal tracking the power point.

8. The apparatus of claim 7, wherein the power monitoring signal comprises a current and a voltage, the filtered power monitoring signal is calculated as dI/dV, and the power point is at dP/dV=0, where I is current, V is voltage, and P is Power.

9. The apparatus of claim 7, wherein the tracking fractional order filter is a high pass Bode Ideal Cutoff (BICO) filter.

10. The apparatus of claim 9, wherein the response of the high pass BICO filter H(s) is calculated as $$H(s) = \frac{K}{\left(\frac{s}{\omega_0} + \sqrt{\left(\frac{s}{\omega_0}\right)^2 + 1}\right)^q}$$

where $\omega_0$ is frequency of an output power, s is frequency, and $0 < q \le 1$.

11. The apparatus of claim 10, wherein the response of the high pass BICO filter H(z) is calculated as $$H(z) = \frac{az^5 - bz^4 + cz^3 - dz^2 - ez - f}{z^5 - gz^4 + hz^3 - jz^2 + kz - l}$$

where z is a complex number and a, b, c, d, e, f, g, h, k, and l are real number constants.

12. The apparatus of claim 7, further comprising a low pass fractional order filter filtering the tracking signal.

13. The apparatus of claim 12, wherein the low pass fractional order filter is a low pass BICO filter.

14. The apparatus of claim 7, further comprising an integrator fractional order filter integrating the tracking signal to form a feedback signal and summing the feedback signal with the perturbation signal to generate a control signal.

15. A system for power point tracking comprising:
a power generator generating raw power;
a power converter converting the raw power to output power;
a fractional order apparatus determining stable coefficients and fractional orders for a tracking fractional order and an integrator fractional order filter;
a demodulation module filtering a power monitoring signal with the tracking fractional order filter to generate a filtered power monitoring signal and demodulating the filtered power monitoring signal with a perturbation signal to generate a tracking signal tracking the power point; and
an integration module integrating the tracking signal with the integrator fractional order filter to form a feedback signal and summing the feedback signal with the perturbation signal to generate a control signal.

16. The system of claim 15, wherein the power monitoring signal measures the raw power.

17. The system of claim 15, wherein the power monitoring signal measures the output power.

18. The system of claim 15, the tracking fractional order filter is a high pass Bode Ideal Cutoff (BICO) filter.

* * * * *